United States Patent
Lee et al.

(10) Patent No.: US 6,331,471 B1
(45) Date of Patent: Dec. 18, 2001

(54) METHOD FOR IMPROVING PEELING ISSUES DURING FABRICATION OF INTEGRATED CIRCUITS

(75) Inventors: Tzung-Han Lee; Wayne Tan, both of Taipei (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/394,559

(22) Filed: Sep. 18, 1999

(51) Int. Cl.⁷ .................................................. H01L 21/20
(52) U.S. Cl. ........................................ 438/396; 438/253
(58) Field of Search .................................. 438/393–399, 438/253–256

(56) References Cited

U.S. PATENT DOCUMENTS 6,010,933 * 1/2000 Cherng .................................. 438/235
6,130,102 * 10/2000 White, Jr. et al. ........................ 438/3

\* cited by examiner

*Primary Examiner*—David Nelms
*Assistant Examiner*—Dung A Le
(74) *Attorney, Agent, or Firm*—Thomas T. Moga, Esq.; Powell, Goldstein, Frazer & Murphy, LLP

(57) ABSTRACT

A new method for forming integrated circuits is disclosed. The method includes the following procedures. A substrate over which a high integration region and a low integration region beside the high integration region are formed. Then dummy layer is formed on the low integration region. Next, a dielectric layer is formed on the high integration region and the dummy layer on the low integration region. Finally, the dielectric layer is planarized.

12 Claims, 4 Drawing Sheets

METHOD FOR IMPROVING PEELING ISSUES DURING FABRICATION OF INTEGRATED CIRCUITS

BACKGROUND OF THE INVENTION

1. Field of the Invention

The present invention relates to a method for fabricating integrated circuits and, more particularly, to improving the peeling issues due to the exposed polysilicon of capacitors after the planarization process.

2. Description of the Prior Art

In general, the fabrication of integrated circuits includes at least four steps with respect to forming polysilicon layers and some steps with respect to forming interconnects. The devices in the substrate should be previously formed.

The first polysilicon layer (poly-1) intends mainly the gate electrodes. It is formed on the substrate and after the devices in the substrate are done. The second polysilicon layer (poly-2) intends mainly the bit lines of integrated circuits. Commonly, they are located over and are perpendicular to the gates. There is at least one dielectric layer formed between two polysilicon layers.

The third polysilicon layer (poly-3), as shown in FIG. 1, usually intends the lower electrodes 102 of capacitors. They are formed on the dielectric layer 101 overhead the second polysilicon layer which is ignored in FIG. 1. Further, the lower electrodes 102 of capacitors directly contact directly to the substrate 100. To increase the storage capacities, different shapes of electrodes have been developed, as for example, a cylinder or a hollow cylinder, etc. A dielectric layer 103 is then formed on the poly-3. The fourth polysilicon layer (poly-4) 104 is subsequently deposited on the dielectric layer 103 to serve as the upper electrodes of the capacitors. According to the steps mentioned above, the capacitors of integrated circuits are then completed.

Before the interconnect metal is fabricated, a dielectric layer 105 should be formed for electric isolation and then planarized to facilitate the fabrication of metal.

Referring to FIG. 2, after the dielectric layer 105 is planarized by chemical mechanical polishing (CMP), the portions, beside the periphery region, of most of the capacitors are easily exposed. In the following steps for forming the first metal level, the glue layer made of Ti will glue on the part of the exposed third and fourth polysilicon layer (102 and 104) of the capacitors. Unfortunately, the short between capacitors and metal levels occurs, moreover, the Ti metal is easily peeled as gluing on the surface of polysilicon. And the peeled Ti particles will obstruct other following steps of the fabrication, for example, the cell defects in the first metal level near the periphery region of the wafer will occur.

For the foregoing reasons, there is a need to develop a method of forming integrated circuits in order to improve the peeling issues mentioned above. Then, the quality of integrated circuits can be increased.

SUMMARY OF THE INVENTION

In accordance with the present invention, a method is provided for forming integrated circuits, that substantially improves the peeling issues. In one embodiment, the method includes the following procedures. First, a substrate, including a first part and a second part, is provided, then a first dielectric layer is formed on the first part and on the second part of the substrate. A first conductor layer, serving as the lower electrode of the capacitor, is defined on the first dielectric layer on the first part. Next, a second dielectric layer is formed on the first conductor layer and then a second conductor layer is formed, serving as the upper electrode of the capacitor, on the second dielectric layer. After, a third dielectric layer is formed on the second conductor layer and on the first dielectric layer on the second part. Subsequently, a fourth dielectric layer is formed on the third dielectric layer. A photoresist, wherein a pattern region is formed over the second part, is formed on the fourth dielectric layer. Etch process is used to etch the third and fourth dielectric layers over the second part and the photoresist is then stripped. Forming the fifth dielectric layer on the fourth dielectric layer over both the first and the second parts. Finally, the fifth dielectric layer is removed till the fourth dielectric layer is exposed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The method for improving peeling issues during fabrication of integrated circuits is illustrated by the following embodiment.

Figure 1:
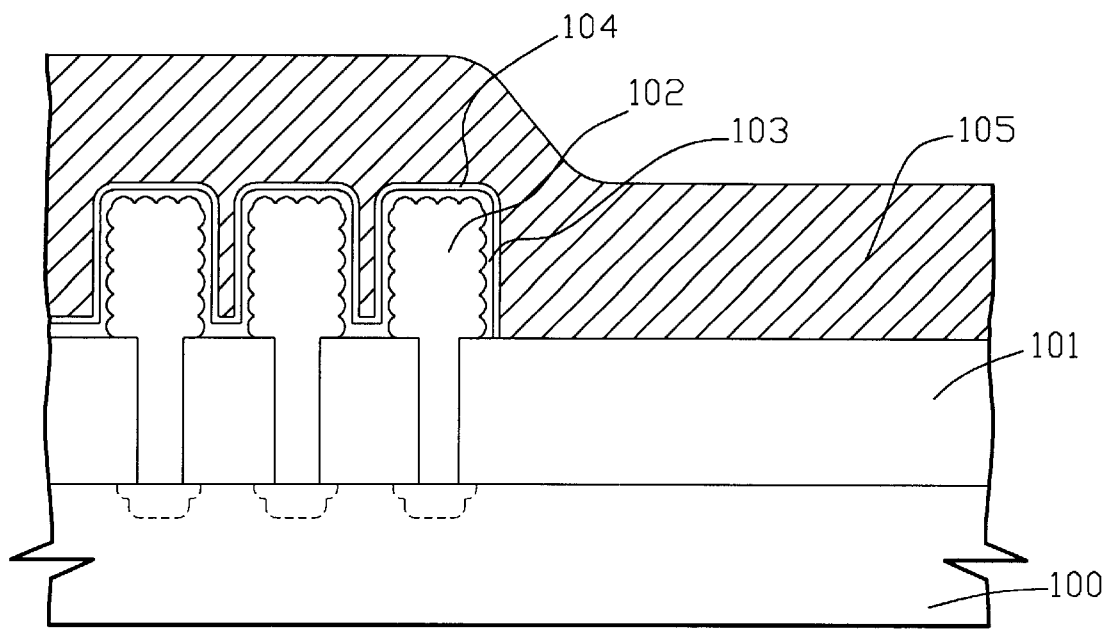
FIG. 1 shows the cross-section view of a portion of conventional integrated circuits.
Figure 2:
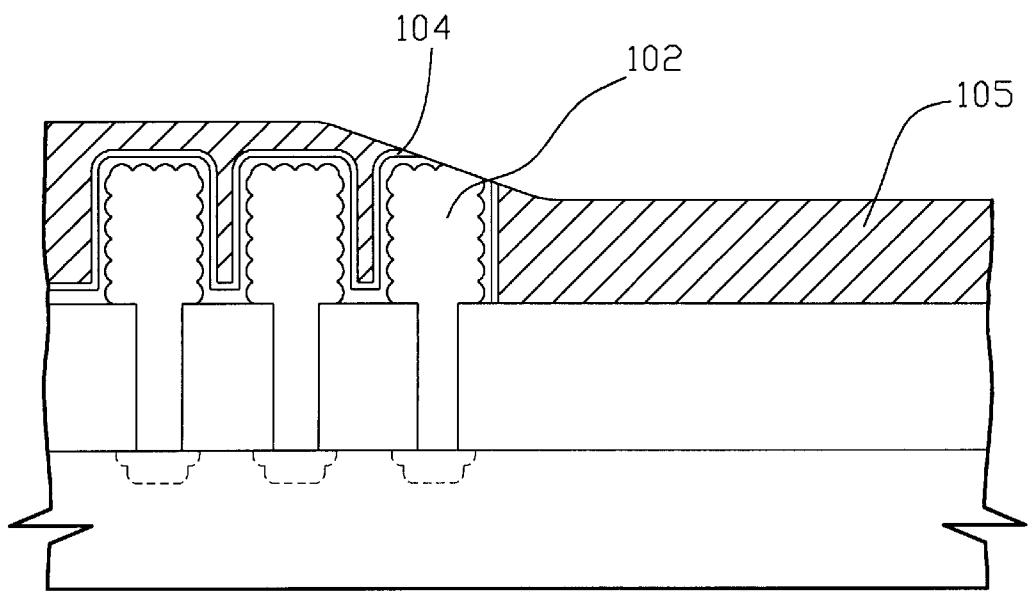
FIG. 2 shows the cross-section view of exposed part of a conventional capacitor after planarization process.
Figure 3:
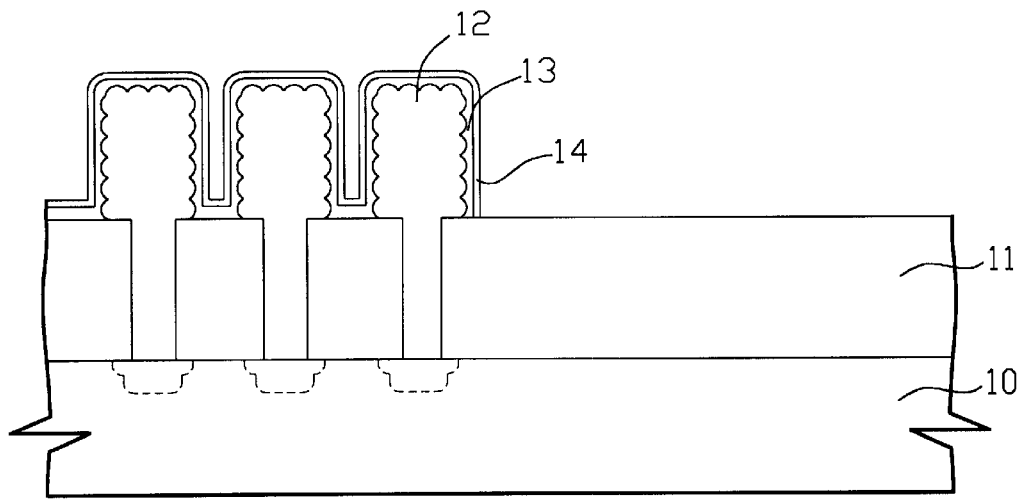
FIGS. 3–7 show the flow cross-section views of a portion of integrated circuits fabricated by the present invention.

Referring to FIG. 3, a substrate 10 is first provided, where the devices desired by products are accomplished previously. Other devices on the substrate 10, not relating to the present invention, will be ignored in the following description. Therefore, the next step is the formation of a dielectric layer 11, such as oxide, over the substrate 10. Then a lithography process and an anisotropic etch process are used for the contact holes of the capacitor, from the top surface of the dielectric layer 11 to the surface of the substrate 10. The dielectric layer 11 is used to isolate the capacitors from the underlying other devices.

A conductor layer 12 such as polysilicon is deposited on the dielectric layer 11 and is fills the contact holes. After a lithography and an etch and other standard conventional processes, the lower cylindrical electrodes 12 of capacitors for charge storage are defined. Therein hemispherical grain (HSG) silicon structures are respectively formed on them. Further, the portion of the conductor layer 12 located on the periphery region is also etched away. Since the periphery region is used to divide the different chips on the wafer, it is not desired to form any electrodes on it. The thin dielectric layer 13 such as an oxide or a silicon nitride is deposited on the conductor layer 12. After a polysilicon layer 14 is deposited on the dielectric layer 13, the capacitors contained by the integrated circuits are completed. Therein the polysilicon layer 14 serves as the upper electrodes of the capacitors.

The fabrication of capacitors contained by the integrated circuits is mainly described above. All of the processes are standard and conventional for the integrated circuit industry. The capacitors described above are much higher than the surface of the periphery region since they are from about 3000 to 10000 angstroms thick. It is difficult to form an uni-height dielectric layer on both the periphery region and the adjacent capacitors. By the present invention, a dummy layer, as high as these capacitors, is suggested and formed on the periphery region to solve the later peeling issues. More details will be described below.

Figure 4:
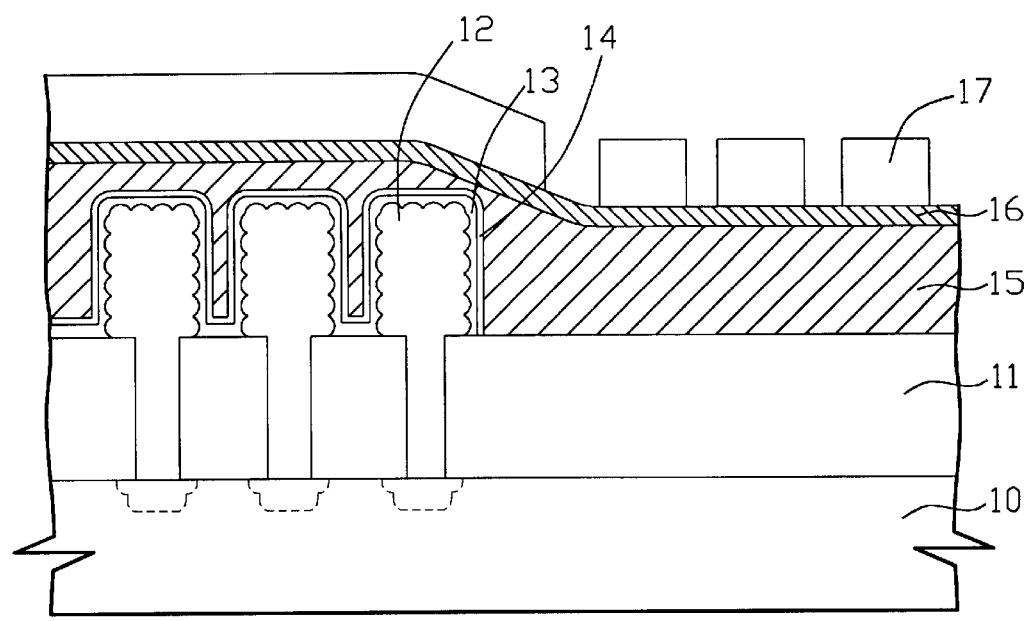

The following step is for isolating the capacitors from the interconnects metal of the integrated circuit and facilitating the forming of the interconnects metal. Then referring to FIG. 4, a dielectric layer 15 such as oxide is deposited on the polysilicon layer 14 and on the dielectric layer 11 on the periphery region. Its thickness is less than previoously known. Then another dielectric layer 16, such as silicon nitride or another material that has a high selectivity, is deposited on the dielectric layer 15. A photoresist 17 is subsequently formed on the dielectric layer 16. A pattern, like that of the lower electrode, is transferred to the portion over the periphery region. The other opposite portion of the photoresist 17 covers all the capacitor region.

Figure 5:
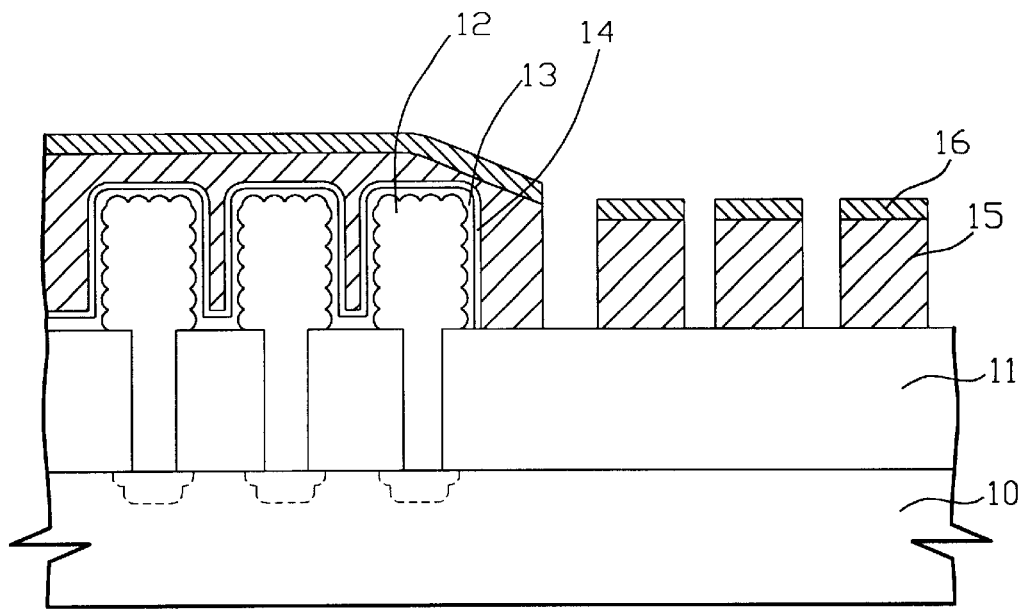

After the dielectric layers 16 and 15 are etched and the photoresist is stripped, the structure is as shown in FIG. 5. Therein all of the capacitors are isolated and buried in the dielectric layer 15. On the other hand, the portion, on the periphery region of the dielectric layer 15, becomes a plurality of cylindrical dummies. The dummy layer 15 reduces the difference between the periphery region and the adjacent capacitors. Moreover, the dielectric layer 16 deposited on the dielectric layer 15 serves as a stop layer for the later planarization process.

Figure 6:
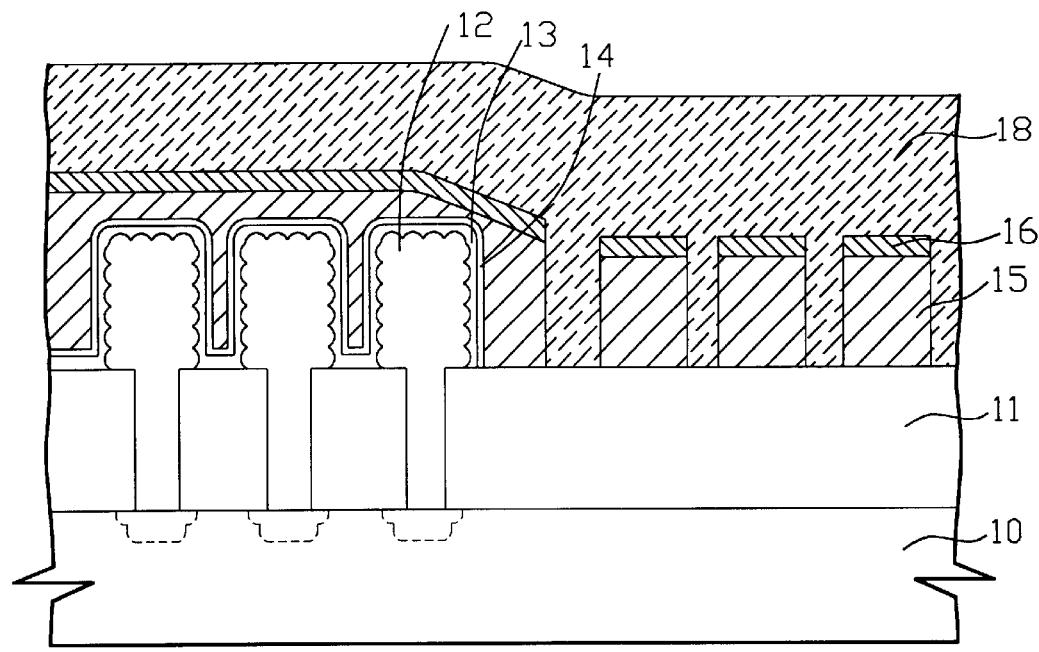

Referring to FIG. 6, a dielectric layer 18 such as oxide is deposited on the dielectric layer 16 and then achieves the purpose of filling gaps among the dummies.

Figure 7:
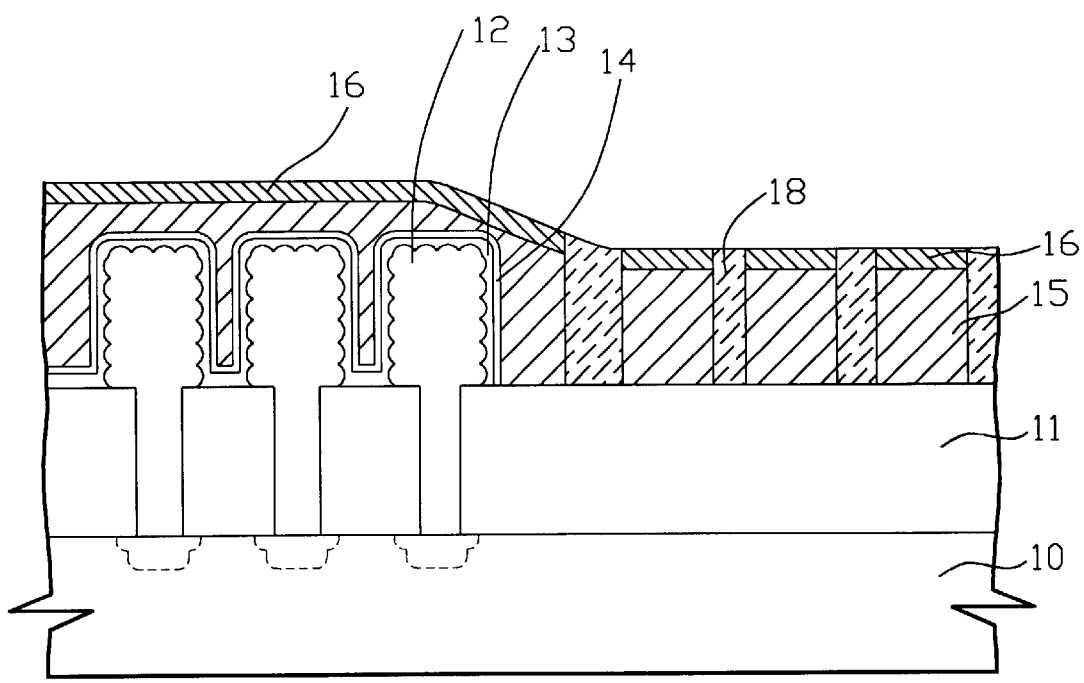

Referring to FIG. 7, the chemical mechanical polishing (CMP) process is used to planarize the dielectric layer 18 until the dielectric layer 16 having a high selectivity is exposed. Therein, the dielectric layer 16 is as a stop layer in the CMP process and its thickness is about 300 to 3000 angstroms.

Although specific embodiments have been illustrated and described, it will be obvious to those skilled in the art that various modifications may be made without departing from what is intended to be limited solely by the appended claims.

What is claimed is:

1. A method for forming integrated circuits, comprising:

providing a substrate including a first part and a second part;

forming a first dielectric layer (11) on said first part and on said second part of said substrate;

defining a first conductor layer (12), serving as lower electrode of the capacitor, on said first dielectric layer (11) on said first part;

forming a second dielectric layer (13) on said first conductor layer (12);

forming a second conductor layer (14), serving as upper electrode of the capacitor, on said second dielectric layer (12);

forming a third dielectric layer (15) on said second conductor layer (14) and on said first dielectric layer (11) on said second part;

forming a fourth dielectric layer (16) on said third dielectric layer (15);

forming a photoresist, wherein a pattern region is formed over said second part, on said fourth dielectric layer (16);

etching said third and fourth dielectric layers (15)(16) over said second part;

stripping said photoresist;

forming a fifth dielectric layer (18) on said fourth dielectric layer (16) over both said first and said second parts; and removing said fifth dielectric layer (18) till said fourth dielectric layer (16) being exposed.

2. The method according to claim 1, wherein said first conductor layer (12) comprises polysilicon.

3. The method according to claim 1, wherein said second dielectric layer (13) comprises oxide.

4. The method according to claim 1, wherein said second dielectric layer (13) comprises silicon nitride.

5. The method according to claim 1, wherein said second conductor layer (14) comprises polysilicon.

6. The method according to claim 1, wherein said third dielectric layer (15) comprises oxide.

7. The method according to claim 1, wherein said fourth dielectric layer (16) comprises silicon nitride.

8. The method according to claim 1, wherein said third and said fourth dielectric layers (15)(16) are etched by anisotropic etch process.

9. The method according to claim 1, wherein said fifth dielectric layer (18) comprises oxide.

10. The method according to claim 1, wherein said fifth dielectric layer (18) is removed by chemical mechanical polishing (CMP) process.

11. The method according to claim 10, wherein said fourth dielectric layer (16) serves as the stop layer during CMP process.

12. The method according to claim 1, wherein said second part includes a periphery region on water.

* * * * *